United States Patent
Dent et al.

[11] Patent Number: 6,044,485
[45] Date of Patent: *Mar. 28, 2000

[54] TRANSMITTER METHOD AND TRANSMISSION SYSTEM USING ADAPTIVE CODING BASED ON CHANNEL CHARACTERISTICS

[75] Inventors: Paul Wilkinson Dent, Stehag, Sweden; Amer Aref Hassan, Cary, N.C.

[73] Assignee: Ericsson Inc., Research Triangle Park, N.C.

[ * ] Notice: This patent issued on a continued prosecution application filed under 37 CFR 1.53(d), and is subject to the twenty year patent term provisions of 35 U.S.C. 154(a)(2).

[21] Appl. No.: 08/789,093

[22] Filed: Jan. 3, 1997

[51] Int. Cl.$^7$ ..................................................... G06F 11/10
[52] U.S. Cl. ............................................................. 714/774
[58] Field of Search ........................... 714/774, 752, 714/753, 758, 786, 792, 712; 379/1

[56] References Cited

U.S. PATENT DOCUMENTS

| | | | |
|---|---|---|---|
| 3,078,443 | 2/1963 | Rose | 340/146.1 |
| 4,047,151 | 9/1977 | Rydbeck et al. | 340/146.1 |
| 4,701,923 | 10/1987 | Fukasawa et al. | 371/41 |
| 5,134,476 | 7/1992 | Aravind et al. | 358/133 |
| 5,230,003 | 7/1993 | Paul W. Dent | 371/43 |
| 5,305,353 | 4/1994 | Weerackody | 375/100 |
| 5,311,547 | 5/1994 | Wei | 375/18 |
| 5,430,743 | 7/1995 | Marturano et al | 371/43 |
| 5,434,886 | 7/1995 | Kazawa et al. | 375/262 |

FOREIGN PATENT DOCUMENTS 0643508  9/1994  France ............................ H04L 1/12

OTHER PUBLICATIONS

D.R. Irvin, "Automatically Reconfiguring Error Correction Method For Speech Comumunications System", © IBM Corp. Technical Disclosure Bulletin, vol. 27, No. 3, Aug. 1984, pp. 1441–1443.

*Primary Examiner*—Hoa T. Nguyen
*Attorney, Agent, or Firm*—Burns, Doane, Swecker & Mathis, L.L.P.

[57] ABSTRACT

A transmitter receives information for transmission to a receiver over a communication channel. A cyclical redundancy checking (CRC) code circuit encodes the information with CRC code for error detection purposes. The CRC coded information is provided to a code switch. The code switch provides the CRC coded information to either a first code circuit or a second code circuit for forward error correction (FEC) coding. The first code circuit may, for example, encode the information using a FEC Code 1, such as convolutional coding, and the second code circuit may encode the information using a FEC Code 2, such as repetition coding. The code switch selects either the first or second code circuit based on detected characteristics of the channel. The channel characteristics may be obtained from a channel estimation circuit, may be obtained from an error feedback signal $I_3$ from the receiver or may be obtained from a combination of both. After the code switch selects the first or second code circuit, the information is appropriately coded to produce a coded signal which is transmitted over the channel by a transmission circuit.

21 Claims, 2 Drawing Sheets

TRANSMITTER METHOD AND TRANSMISSION SYSTEM USING ADAPTIVE CODING BASED ON CHANNEL CHARACTERISTICS

BACKGROUND OF THE INVENTION

The present invention relates to a transmitter and method for transmitting coded signals over a channel which may have changing characteristics over time and, more particularly, to a transmitter, transmission system and method wherein characteristics of the channel are substantially continually detected, a code technique is selected based on the characteristics and the signals are coded in the selected code technique.

In a current communications system, information is processed and converted to electrical signals on an originating end of the system (such as a transmitter). The electrical signals are then transmitted over a communications channel to a receiving end of the system (such as a receiver). The receiver then processes the electrical signals and converts the signals back into the information. Numerous factors influence the speed, efficiency and reliability of the communication process. One significant factor is whether the communication channel is changing over time. The characteristics of the channel are especially prone to be changing if the transmitter, receiver or both are moving.

In an effort to reduce errors caused by changes in the characteristics of the channel, the electrical signals are often coded with special error detection and correction information. One example of a well known error detection technique is the use of cyclical redundancy checking (CRC) code. Two examples of well known error correction (often called forward error correction, or FEC) techniques are convolutional coding and repetition coding. A number of other coding techniques are also known in the art. For ease of description and clarity, the present invention will be described using only the CRC coding and the FEC coding techniques. Those skilled in the art will readily understand, however, that any of the known coding techniques may be advantageously employed in the present invention.

The performance level of each of the coding techniques is dependent upon the characteristics of the channel. In other words, some coding techniques perform better on a noisy channel while other techniques perform better on a quiet channel. Unfortunately, as noted above, the characteristics of a channel may be changing over time, especially with respect to mobile communications and the like. Prior transmitters are designed to implement a single predetermined coding technique during a transmission of information. These prior transmitters are therefore unable to accommodate these changing channel characteristics and, therefore, may experience less than optimal, or desired, performance.

Accordingly, there is a need in the art for a transmitter, method and transmission system for transmitting information which detects characteristics of a channel, selects a proper coding technique based on the detected channel characteristics, codes the information using the selected coding technique and transmits the coded information.

SUMMARY OF THE INVENTION

This need is met by a transmitter, transmission system and method in accordance with the present invention wherein characteristics of a channel are monitored, wherein a coding technique is selected based on the monitored characteristics and wherein information is coded based on the selected coding technique.

In accordance with one aspect of the present invention, a transmitter receives information to be transmitted over a channel at a source interface. A code selection circuit detects, or monitors, characteristics, such as the amount of noise, interference and the like, of the channel which may be changing. Based on these detected characteristics the code selection circuit selects an appropriate code for coding the information and accordingly codes the information. The resultant coded signals are then transmitted over the channel.

The code selection circuit may have first and second code circuits for coding the information in either a first or second code, respectively. A code switch then selects one the code circuits based on the characteristics of the channel. Two exemplary codes which may be employed are a convolutional code and a repetition code. In addition, error detection coding, such as cyclical redundancy checking, may be performed by a cyclical redundancy checking circuit on the information prior to transmission. To detect channel characteristics, a channel estimation circuit may estimate the changing characteristics of the channel and/or feedback indicative of the characteristics of the channel may be received from an intended receiver.

In accordance with another aspect of the present invention, a method is disclosed for transmitting coded signals over a channel. The method comprises the steps of: receiving information; detecting characteristics of the channel; selecting one of a first code and a second code based on the determined characteristics of the channel; coding the information signals using the selected one of the first and second codes to produce coded signals; and transmitting the coded signals over the channel.

In yet another aspect of the present invention, a transmission system transmits coded signals over a channel which may have changing characteristics over time. A transmitter receives information to be transmitted over the channel. The characteristics of the channel are detected and the information is coded based on the characteristics of the channel to produce coded signals. These coded signals are then transmitted by the transmitter over the channel and are received by a receiver.

These and other features and advantages of the present invention will become apparent from the following detailed description, the accompanying drawings and the appended claims.

DETAILED DESCRIPTION OF THE INVENTION

Figure 1:
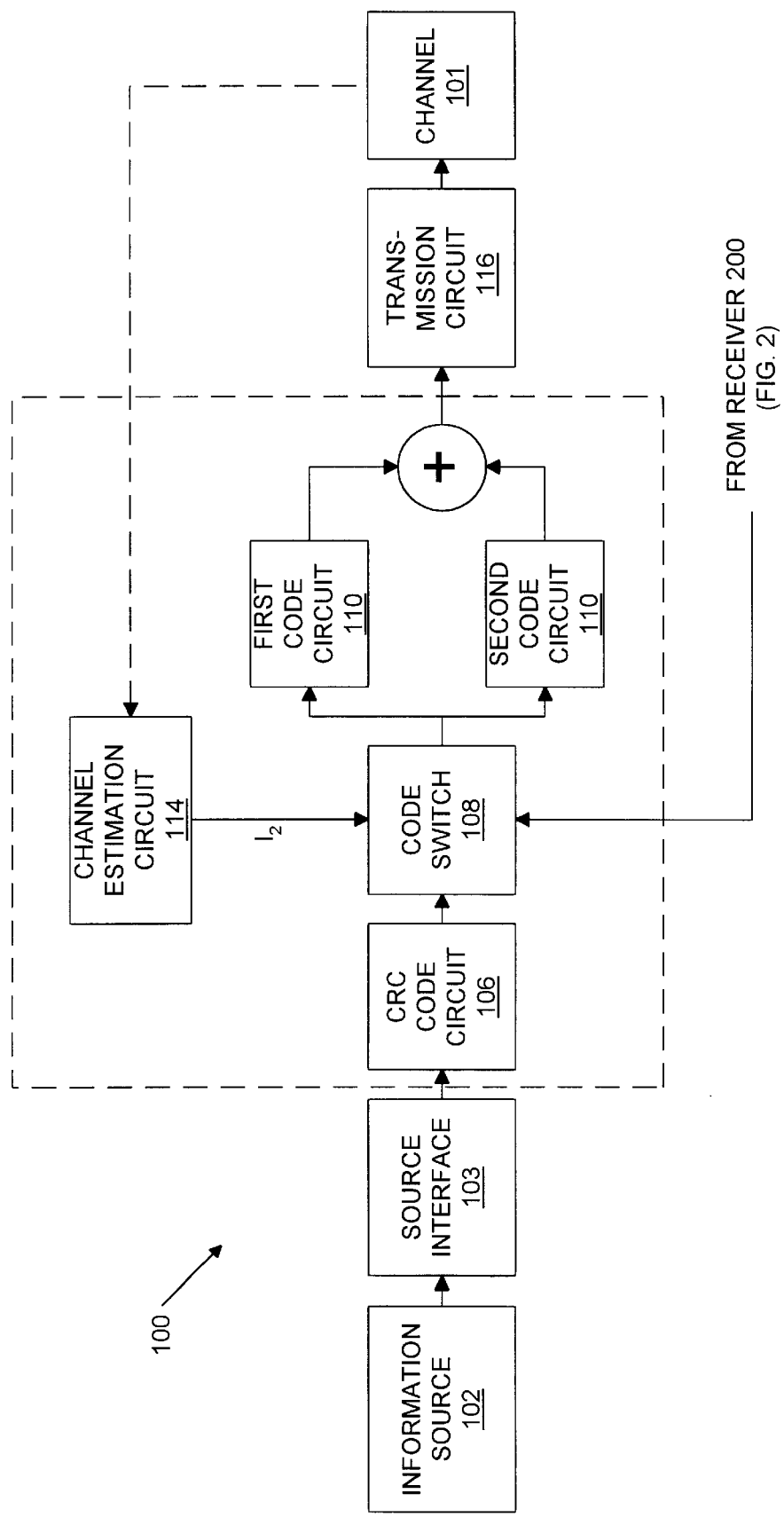
FIG. 1 is a block diagram of a transmitter in accordance with the present invention.
Figure 2:
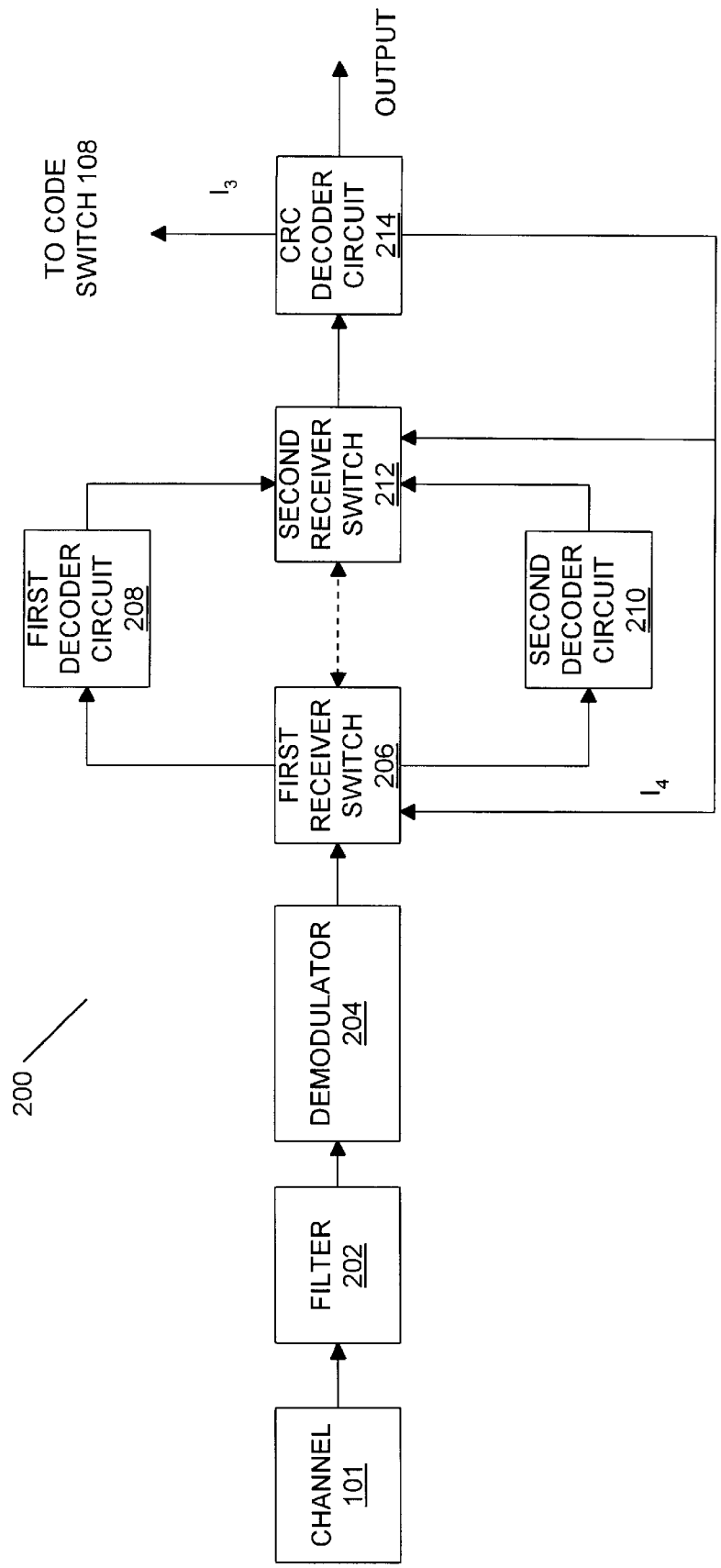
FIG. 2 is a block diagram of an exemplary receiver which may be employed to receive coded signals transmitted by the transmitter shown in FIG. 1 in accordance with the present invention.

A transmission system comprising a transmitter 100 and a receiver 200 which communicate over a channel 101 in accordance with one aspect of the present invention is shown in block diagram form in FIGS. 1 and 2. The transmitter 100 receives an information signal, or information sequence, from an information source 102 via an information interface 103. The information source 102 may be, for example, a computer, a facsimile machine, a speech vocoder or any other device which generates an information sequence. As those skilled in the art will readily appreciate, the structure, control and arrangement of the conventional components and circuits have, for the most part, been illustrated in the drawings by readily understandable block representations and schematic diagrams, which show only those specific details that are pertinent to the present invention, in order not to obscure the disclosure with structural details which will be readily apparent to those skilled in the art having the benefit of the description herein.

A code selection circuit 104 receives the information signals and properly encodes the information signals for transmission to the receiver 200. Various coding techniques, or types, have been developed to assure accurate transmission and reception of the information signals. Each of the known coding techniques has advantages and disadvantages and is more or less reliable depending upon characteristics of the channel over which the transmission occurs. Unfortunately, the characteristics of a channel may be changing over time, especially with respect to mobile communications and the like. Since prior transmitters encode the information signals using a predetermined coding technique, transmissions may be made using a coding technique which is less than optimal for certain channel characteristics. Consequently, transmission systems using the prior transmitters, may experience less than desired performance.

The code selection circuit 104 of the present invention overcomes this deficiency in prior transmitters by dynamically selecting a coding technique based on the determined characteristics of the channel 101 during transmission. A cyclical redundancy checking (CRC) circuit 106 may encode the information signals with CRC code. The CRC circuit 106 maps each k symbols of the information signal into n symbols of CRC code. The n–k symbols which are added during the CRC procedure are called parity symbols. These parity symbols are determined based on the particular block of k symbols at the input of the CRC circuit 106. As will be discussed below with respect to the receiver 200, the CRC code is used during the decoding process to detect when error correction coding has failed. Since the CRC coding method is well known in the art, it will not be further described herein.

The CRC coded information signal from the CRC circuit 106 is transmitted to a code switch 108 which selects one of a first code circuit 10 or a second code circuit 112 for further coding of the CRC coded information signals. The code switch 108 makes this selection based on determined, or detected, characteristics of the channel 101. The code switch 108 is shown in FIG. 1, for example, as receiving information from a channel estimation circuit 114 and the receiver 200.

The channel estimation circuit 114 generates an estimate of the characteristics of the channel 101. One method for estimating the channel characteristics is by occasionally sampling the physical channel at the transmitter 100 and processing these samples by the channel estimation circuit 114 in a well known manner. As those skilled in the art will readily comprehend, this method requires that the transmitter 100 be a full duplex transmit/receive system, i.e. it includes a receiver circuit (not shown). The receiver circuit of the transmitter 100 samples the channel 101 simultaneous with the transmitter 100 transmitting the coded signals over the channel 101 in a well known manner. Based on this sampling, the channel estimation circuit 114 then indicates to the code switch 108 whether the channel 101 is reliable or unreliable via signal $I_2$. Numerous characteristics may be used to determine whether the channel 101 is reliable or not. For example, a reliable channel may be one having a high signal-to-noise ratio (SNR). Although other known characteristics of the channel may be used to control the code switch 108, only high and low SNR will be discussed herein for ease of description.

If the channel estimation circuit 114 indicates that the channel 101 is reliable (high SNR), the code switch 108 selects the first code circuit 110 to further encode the CRC coded information signals. For exemplary purposes, the first code circuit 110 uses forward error correction (FEC) code 1 to transmit the CRC coded information signals. Alternatively, if the channel estimation circuit 114 indicates that the channel 101 is unreliable (low SNR), the code switch 108 selects the second code circuit 112 to further encode the CRC coded information signals. The second code circuit 112 uses a possibly distinct FEC code 2 to transmit the CRC coded information signals.

As is known, FEC coding involves encoding bit sequences with redundant information before transmission so that errors can be detected at the receiving end. The FEC code 1 may preferably be a rate 1/n convolutional code and FEC code 2 is preferably a rate 1/n repetition code. The FEC code 1 (1/n convolutional code) performs better with a high SNR than the FEC code 2 (1/n repetition code). Conversely, the FEC code 2 performs better than the FEC code 1 over channels having a low SNR, such as when a channel is in deep fade. As shown in the example, both of the FEC codes 1 and 2 preferably have the same code rate so that the information rate is not changed. In addition, the FEC codes may be any of a number of well known codes including, among others, a null code wherein no additional coding is performed.

The code switch 108 may also receive information directly from the receiver 200 via signal $I_3$. Error signal $I_3$ is a feedback signal from the receiver 200 indicating that the receiver 200 is unable to reliably decode the transmitted coded signals. One exemplary method for generating signal $I_3$ is by transmitting known symbols over the channel and processing the received signal using the known symbols. Any deviation from the known symbols would thus indicate an error in transmission which is relayed to the transmitter 100 via signal $I_3$. Using signal $I_3$, the receiver 200 thereby requests that a different FEC code be used. The error signal $I_3$ may be used when the channel estimation circuit 114 is unable to estimate the characteristics of the channel 101. Alternatively, the error signal $I_3$ may be used in conjunction with signal $I_2$ for selecting the appropriate FEC code.

The coded signals produced by the selected code circuit 110 or 112 is then provided to a transmission circuit 1 16 for transmission to the receiver 200. Various well known functions may be performed on the coded signals by the transmission circuit 116. For example, the coded signals may be modulated (amplitude, frequency or phase) and filtered. The transmission circuit 116 may further include an antenna or other device for transmitting the coded signals over the channel 101.

The coded signals are received by the receiver 200 from the channel 101. The coded signals are filtered by a filter 202 and demodulated by a demodulator 204. The coded signals are then supplied to a first receiver switch 206 which selects either a first decoder circuit 208 or a second decoder circuit 210 to decode the coded signals. In accordance with the exemplary code selection circuit 104 described above, the first decoder circuit 208 decodes FEC code 1 and the second decoder circuit 210 decodes FEC code 2. A second receiver switch 212 connects either the first decoder circuit 208 or the second decoder circuit 210 with a CRC decoder circuit 214.

The first and second receiver switches 206 and 212 are synchronized such that the proper decoder circuit 208 or 210 is connected to the CRC decoder circuit 214. As is well known, a CRC decoder circuit is a very reliable detector of errors in decoded information. Since the receiver 200 does not necessarily know which FEC code is being used, the CRC decoder circuit 214 indicates to the first and second decoder switches 206 and 212 when an incorrect decoder circuit is being used via a feedback signal 14. For example, if the switches 206 and 212 connect the correct decoder circuit 208 or 210, the CRC decoder circuit 214 decodes the resultant information and its output is considered a faithful reproduction of the transmitted coded signals. On the other hand, if the switches 206 and 212 connect the wrong decoder circuit 208 or 210, the CRC decoder circuit 214 would be unable (with high probability) to decode the resultant signals. The CRC decoder circuit 214 then instructs the switches 206 and 212 to connect the other decoder circuit 208 or 210 via signal 14. A receiver having a similar configuration for decoding multiple codes is disclosed in U.S. Pat. No. 5,230,003 issued to Dent et al. on Jul. 20, 1993, entitled "Decoding System for Distinguishing Different Types of Convolutionally-Encoded Signals", the disclosure of which is hereby incorporated by reference.

Having thus described the invention in detail by way of reference to preferred embodiments thereof, it will be apparent that other modifications and variations are possible without departing from the scope of the invention defined in the appended claims. For example, the receiver 200 may have design configurations which depart from those described herein. Therefore, the spirit and scope of the appended claims should not be limited to the description of the preferred versions contained herein.

What is claimed is:

1. A transmitter for transmitting coded signals over a channel, the channel may have changing characteristics over time, the transmitter comprising:

a source interface for receiving information;

a code selection circuit for detecting the characteristics of the channel, for selecting one of a first code and a second code based on the characteristics of the channel and for coding the information in the selected one of the first and second codes to generate coded signals, wherein said first code and said second code are different codes having the same coding rate; and a transmission circuit for transmitting the coded signals over the channel.

2. The transmitter as recited in claim 1 wherein the code selection circuit comprises:

a first code circuit for coding, when selected, the information in the first code;

a second code circuit for coding, when selected, the information in the second code; and a code switch for selecting one of the first code circuit and the second code circuit based on the characteristics of the channel.

3. The transmitter as recited in claim 2 wherein the first code circuit comprises a convolution code circuit for coding the information using a convolutional code.

4. The transmitter as recited in claim 3 wherein the second code circuit comprises a repetition code circuit for coding the information using a repetition code.

5. The transmitter as recited in claim 4 wherein the code selection circuit comprises:

a cyclical redundancy checking circuit for encoding the information prior to receipt of the information signals by the code switch.

6. The transmitter as recited in claim 2 wherein the second code circuit comprises a repetition code circuit for coding the information using a repetition code.

7. The transmitter as recited in claim 1 wherein the channel circuit comprises a channel estimation circuit for estimating the characteristics of the channel.

8. The transmitter as recited in claim 1 wherein the code circuit comprises a cyclical redundancy checking circuit for encoding the information.

9. A method for transmitting coded signals over a channel, the channel may have changing characteristics over time, the method comprising the steps of:

receiving information;

detecting the characteristics of the channel;

selecting one of a first code and a second code based on the determined characteristics of the channel, wherein said first code and said second code are different codes having the same coding rate;

coding the information using the selected one of the first and second codes to produce coded signals; and transmitting the coded signals over the channel.

10. The method as recited in claim 9 further comprising the step of:

encoding the signals with cyclical redundancy checking code before the step of transmitting.

11. The method as recited in claim 9 wherein the step of selecting comprises the step of:

providing a convolutional code as the first code.

12. The method as recited in claim 11 wherein the step of selecting comprises the step of:

providing a repetition code as the second code.

13. The method as recited in claim 9 further comprising the step of:

modulating the coded signals before the step of transmitting.

14. The method as recited in claim 9 wherein the step of detecting comprises the step of:

estimating the characteristics of the channel.

15. The method as recited in claim 9 wherein the step of detecting comprises the step of:

detecting a signal to noise ratio of the channel.

16. A transmission system for transmitting coded signals over a channel, the channel may having changing characteristics over time, the system comprising:

a transmitter for receiving information to be transmitted over the channel, for detecting the characteristics of the channel, for coding the information based on the characteristics of the channel to produce coded signals, and for transmitting the coded signals over the channel, wherein the information is coded according to one of a plurality of different codes having the same coding rate; and a receiver for receiving the coded signals.

17. The transmission system as recited in claim 16 wherein the transmitter comprises:

a code selection circuit for selecting one of a first code and a second code based on the characteristics of the channel and for coding the information in the selected one of the first and second codes.

18. The transmission system as recited in claim 17 wherein the transmitter comprises:

a channel estimation circuit for estimating the characteristics of the channel.

19. The transmission system as recited in claim 17 wherein the code selection circuit comprises:

a first code circuit for coding the information in the first code;

a second code circuit for coding the information in the second code; and a code switch for selecting one of the first code circuit and the second code circuit to code the information based on the characteristics of the channel.

20. The transmission system as recited in claim 19 wherein the receiver comprises:

a decoder selection circuit for detecting the one of the first and second codes selected for coding the transmitted coded signals;

a decoder circuit for decoding the coded signal in response to the decoder selection circuit.

21. The transmission system as recited in claim 20 wherein the decoder selection circuit comprises:

a notification circuit for generating error signals representative of improper receipt of the coded signals and for transmitting the error signals to the transmitter, and wherein the code switch may select the other one of the first and second code circuits based on the error signal.

* * * * *